United States Patent
Mälhammar

(12) 
(10) Patent No.: US 6,259,602 B1
(45) Date of Patent: Jul. 10, 2001

(54) HEAT CONDUCTIVE DEVICE

(75) Inventor: Åke Mälhammar, Stockholm (SE)

(73) Assignee: Telefonaktiebolaget L.M. Ericsson, Stockholm (SE)

( * ) Notice: Subject to any disclaimer, the term of this patent is extended or adjusted under 35 U.S.C. 154(b) by 0 days.

(21) Appl. No.: 09/117,028

(22) PCT Filed: Feb. 1, 1997

(86) PCT No.: PCT/SE97/00158

§ 371 Date: Jul. 22, 1998

§ 102(e) Date: Jul. 22, 1998

(87) PCT Pub. No.: WO97/31513

PCT Pub. Date: Aug. 28, 1997

(30) Foreign Application Priority Data

Feb. 21, 1996 (SE) .................................................. 9600649

(51) Int. Cl.⁷ ............................................................ H05K 7/20
(52) U.S. Cl. .................... 361/704; 165/80.3; 165/185; 174/16.3; 257/706; 257/712; 361/710
(58) Field of Search .................... 165/80.2, 80.3, 165/185; 174/16.3; 257/706–707, 712–713, 718–719, 726–727; 361/704–705, 707–710, 715, 717–718, 722

(56) References Cited

U.S. PATENT DOCUMENTS

| 3,519,889 | 7/1970 | Monaco . |
| 4,442,450 | * 4/1984 | Liptschutz et al. .................. 361/704 |
| 4,674,005 | 6/1987 | Lacz . |
| 4,689,720 | * 8/1987 | Daszkowski ......................... 361/704 |
| 5,130,888 | 7/1992 | Moore . |
| 5,327,324 | 7/1994 | Roth . |
| 5,557,501 | * 9/1996 | DiStefano et al. ................... 361/704 |
| 5,650,913 | * 7/1997 | Kochanski ............................ 361/704 |

FOREIGN PATENT DOCUMENTS

| 4324214A1 | 1/1995 | (DE) . |
| 0151068 | 9/1989 | (EP) . |
| 0541451 | 1/1995 | (EP) . |
| 0668715A1 | 8/1995 | (EP) . |
| 0433021 | 4/1984 | (SE) . |

* cited by examiner

*Primary Examiner*—Gregory Thompson
(74) *Attorney, Agent, or Firm*—Burns, Doane, Swecker & Mathis L.L.P.

(57) ABSTRACT

The present invention relates to a thermally conductive device (1) which is intended to establish mechanical and thermal contact between a first body (2), such as an electric and/or electronic circuit, and a second body (31), such as a cooling body, for the purpose of smoothing-out a temperature gradient occurring between the first and the second body. The device includes a first and a second contact pad (11, 12) and an element (13) acting therebetween. The first contact pad (11) is adapted for coaction with the first body (2) and the second contact pad (12) is adapted for coaction with the second body (31). The element (13) has at least one region (63a) that has a specific bending resistance. The region or region-proximate parts have a thermal conductance which is slightly lower than the thermal conductance of the region (5) located adjacent the region-proximate parts.

74 Claims, 6 Drawing Sheets

HEAT CONDUCTIVE DEVICE

FIELD OF INVENTION

The present invention relates to a thermally conductive device for mechanical and thermal contact between a first body, such as an electric and/or an electronic circuit, and a second body, such as a cooling body.

The object of this contact is to smooth-out any temperature gradients that may occur between the first and the second bodies, by conducting heat from the first body to the second body.

The device includes a first and a second contact pad and a resilient or flexible element acting therebetween.

The first contact pad is adapted for coaction with a first contact surface of the first body, the second contact pad is adapted for coaction with a second contact surface of the second body and the resilient or flexible element is intended to adapt to variations in the distance or spacing between the two bodies that occur as result of temperature variations in time, while retaining thermal contact therebetween.

When the temperature of the first body is higher than the temperature of the second body, heat can be conducted from the first body to the first contact pad, via the thermal contact between said first body and said first contact pad, and from the first contact pad to the second contact pad via the intermediate resilient or flexible element, and from the second contact pad to the second body via the thermal contact between the second contact pad and the second body.

The present invention relates to a thermally conductive device which is particularly adapted to function between an electric and/or electronic component that is mounted in the proximity of a cooling body, such as inside a metal cassette, and/or in the proximity of a cooling body, such as a cooling flange, wherein the device is intended to conduct heat from the component to the cassette wall and/or the cooling flange.

BACKGROUND OF THE INVENTION

So that the prior art relevant to the present invention may be more readily understood, the known prior art will be described in two different aspects.

In a first aspect, in which a hot and a cold body are related to one another such that a thermally conductive device acting therebetween is able to coact with respective bodies through the medium of mutually facing contact surfaces, and such that the thermally conductive device can be clamped in between the two bodies.

A second aspect relates to the same situation, although with the difference that the contact surfaces do not face towards one another and the thermally conductive device cannot be clamped between the two bodies.

The first aspect of the known prior art will be described first.

It has long been known to conduct heat from a hot body to a cold body through the medium of some type of thermally conductive device which applies a force against both the hot and the cold body.

When applying the present invention, it is important that the thermally conductive device applies a force between the component and the cooling body that is adapted to the mechanical strength of the circuit board, so that the combined force exerted by a plurality of thermally conductive devices will not result in deformation of the circuit board and to the detriment of the circuit board components or to the actual connections of said mounted components. For instance, a circuit board that includes surface-mounted components is particularly sensitive to mechanical influences wherewith circuit board deformation may result in total or partial release of the solder with which the legs of the surface-mounted components are affixed to the circuit board.

It is also important that the force exerted by the thermally conductive device between the component and the cooling body will not act detrimentally on the cooling body. For instance, when the cooling body is a cassette wall, the force must be adapted to the mechanical strength of said wall, while taking into account the fact that several such devices will act against the same wall and ensuring that the total force exerted by said devices will not result in detrimental deformation of the wall.

It has long been known to allow the heat that radiates from box-enclosed electronic components to be transferred from respective components to the box walls through the medium of the air gap present between the components and the box. This method is useful with components that radiate very small quantities of heat.

It is also known to fabricate a circuit board, on which components are mounted, in mechanical and thermal contact with one of the box walls, so that heat will be conducted from the components to the circuit board and from there to the box. In this case, however, it is necessary that one side of the circuit board is free from components. Neither is it always desirable to conduct heat from the components down into the circuit board.

It is also known to use different types of filling material between the air gap present between components and box. This application requires the use of some type of thermally conductive filling material. Rubber discs or rubber plates are one example of such filling materials. Although rubber discs or plates are effective, they require a very high contact pressure in order to fill the air gap satisfactorily. It is also known to use a very soft rubber-like material that can be brought to desired shapes that are effective in filling irregular air gaps. This material, however, has a much lower thermal conductivity.

Liquid filled plastic pads are another example of such filling materials, although such pads have a limited useful life and efficacy.

Foam material filled with liquid metal is still another example of such filling materials. This solution is highly expensive, however.

Thermally conductive filling materials and double-sided adhesive tapes are marketed by Chomerics, Inc., U.S.A., Thermagon, Inc., U.S.A. and The Bergquist Co., U.S.A., for instance.

It is also previously known to press between electric components a resilient device that will function to conduct heat from respective components to a cooling body. Different examples of this solution are illustrated in publications U.S. Pat. No. 4,674,005, DE-A1-4 324 214 and EP-A1-0 668 715.

Publication EP-A-0 151 068 describes a cooling system which includes, among other things, a heat transfer device that is in contact with the component to be cooled.

The heat transfer device is pressed against the component via a thermo-deformable or thermo-compressible non-rigid bellows-type device such as to transport a coolant. This coolant transports heat from the heat transfer device into a cooling system.

The cooling system also includes a conduit means through which the coolant flows, and a cooling module which functions to cool the coolant.

The non-rigid device may also include a spring which functions to press the heat transfer device against the component.

Other publications that disclose devices that can be considered to form part of the known prior art are publications SE-B-0 433 021 and EP-A-0 541 456.

The known prior art according to the second aspect will now be described.

It is known to mount a cooling body, such as a cooling flange on or in the vicinity of a circuit board on which hot bodies, such as electric and/or electronic components, are mounted. A cooling "flange" may also be comprised of one side of a cassette in which the circuit board with component is mounted.

In these cases, the cooling flange will often be positioned so that its contact surface does not lie immediately above the body to be cooled, and consequently it is not possible to clamp a thermally conductive device between the two bodies in a natural manner so to speak.

It is also known in this second aspect of the prior art to use different types of filling material, although this is difficult to achieve by virtue of the fact that the material cannot be clamped in between the two bodies.

It is also known to fasten between a cooling flange and a component tongue-shaped strips that function to conduct heat from the component to the cooling flange.

These strips may be comprised of a plurality of mutually superimposed foils which are slidably fastened at one body, or at both bodies, to allow a height variation between the two bodies caused by variations in temperature, for instance.

With the intention of enabling the present invention to be understood more thoroughly and with the intention of simplifying the description of the present invention, the following expressions are used in the description and Claims.

Thermal resistivity and thermal conductivity are used synonymously and describe the ability of a certain material to conduct heat.

Thermal resistance and thermal conductance are used synonymously and describe a total absolute value of the ability of a device to conduct heat, and are determined by the thermal resistivity or thermal conductivity of the material included in the device, and the dimensioning of said device.

When a device is comprised of a material that has a certain thermal conductivity and that is not fully determined with respect to its dimensions, this is defined by the expression thermal conductance. This expression can be illustrated, for instance, by the fact that the thermal conductance of a cylinder comprised of a given material and having a diameter of 2 cm will be higher than the thermal conductance of a cylinder of the same material but having a diameter of 1 cm.

The total thermal resistance of the cylinder is not determined by diameter alone, since the length of the cylinder and the thermal resistivity or thermal conductivity of the material must also be known in order to determine this parameter. Nevertheless, it is possible to discuss the thermal conductance of a device, or part of a device, on the basis of a limiting dimension, such as the diameter of a cylinder, without having knowledge of all dimensions or of the thermal resistivity or thermal conductance of the material.

SUMMARY OF THE INVENTION

TECHNICAL PROBLEMS

With respect to a thermally conductive device that is intended to establish mechanical and thermal contact between a first body, such as an electric and/or electronic circuit, and a second body, such as a cooling body, with the intention of smoothing-out occurrent temperature gradients between the first and the second body, comprising a first and a second contact pad and a resilient element acting therebetween, wherein the first contact pad is adapted for coaction with a first contact surface belonging to the first body, the second contact pad is adapted for coaction with a second contact surface belonging to the second body, wherein the first and the second body are positioned in relation to one another so that the two contact surfaces will face towards one another, and wherein the resilient element is adapted to exert a predetermined pad-separating force against the first and the second contact pad respectively such that said pads will press against respective first and second bodies, it will be seen when considering the earlier state of the art that a technical problem resides in the ability to design the resilient element so that it will exhibit an adapted high degree of compressibility that is representative of the predetermined force, at the same time as the device exhibits in total an adapted high thermal conductance.

Another technical problem is one of realizing how a thermally conductive device shall be designed to enable it to be compressed and expanded respectively in response to variations in the distance between the first and the second body, e.g. variations due to temperature variations or changes in the vertical dimensions of components for instance.

It will also be seen that a technical problem resides in providing a thermally conductive device that is of very simple construction but is nevertheless able to solve these technical problems.

Another technical problem is one of realizing how an attached rod shall be designed to afford a high thermal conductance and, at the same time, have a very low bending resistance to a force that acts laterally in relation to the longitudinal axis of the rod.

It will also be seen that a technical problem resides in realizing how knowledge of the thermal conductance and the bending resistance of a rod can be used in the construction of a thermally conductive device.

Another technical problem is one of realizing the advantages that are afforded by a device in which the resilient element includes at least one resilient configuration wherein each resilient bent region in the resilient configuration is allocated a specific bending resistance and a specific thermal conductance.

Another technical problem is one of realizing the possibilities that are afforded when one bent region can be given a bending resistance and/or a thermal conductance that deviates from the bending resistance and/or the thermal conductance of one or several other bent regions.

Another technical problem is one of realizing how a device shall be designed in order to enable it to be produced readily in the form of a single bar.

Yet another technical problem is one of realizing the technical manufacturing advantages that are afforded when respective bent regions are comprised of a material-thinning groove, where respective bent regions may consist of a permanently bent region.

It will also be seen that a technical problem resides in dimensioning the bar and the material-thinning grooves provided therein such as to obtain a predetermined low bending resistance in each bent region and a predetermined high thermal conductance with respect to the thermally conductive device.

A further technical problem is one of realizing the manufacturing advantages that are obtained when the device is comprised of plates where the bent regions are comprised of a foil bridge and where the foil is bent or curved between the plates in a manner to form said thermally conductive device.

It will also be seen that a technical problem resides in adapting the dimensions of the plates and the foil bridges and also the distance between two mutually adjacent plates such as to obtain a predetermined low bending resistance in each bent region, and a predetermined high thermal conductance in respect of the thermally conductive device.

Another technical problem is one of realizing how plates and one or more foil bridges can be mutually joined in a satisfactory manner.

Still another technical problem is one of realizing the importance of the ability of the device to take-up deviations in parallelism between two bodies while retaining the desired high thermal conductance of the device and the low bending resistance in the bent regions, essentially irrespective of the embodiment concerned.

Another technical problem is one of realizing how a device shall be constructed to take-up such deviations in parallelism between the two bodies.

It will also be seen that a technical problem resides in realizing the conditions required to prevent adjacent legs from contacting one another as bending occurs in said bent region, when using a material-thinning groove or a foil bridge in said bent region.

It can also be considered problematic to realize how to avoid mutual contact between two adjacent legs as a result of a bend in said bent region.

Another technical problem resides in the choice of a suitable material for the bar, the plates and the foil bridges.

It will also be seen that a technical problem resides in realizing how a plurality of thermally conductive devices can be applied between a plurality of cassette-mounted components and the inner surface of a cassette wall.

With respect to a thermally conductive device that is intended to make mechanical and thermal contact between a first body, such as an electric and/or electronic circuit, and a second body, e.g. a cooling body, in order to smooth-out any temperature gradients that may occur between the first and the second bodies, such as to conduct heat from the first body to said second body, and which comprises a first and a second contact pad and a resilient element acting therebetween, wherein the first contact pad is adapted for coaction with a first contact surface belonging to said first body, said second contact pad is adapted for coaction with a second contact surface belonging to said second body, wherein said two bodies are positioned mutually so that said two contact surfaces will essentially face in mutually the same direction, and wherein said flexible element is adapted to allow relative perpendicular movement between said first and said second contact surfaces while retaining the coaction between said first contact pad and said first surface and the coaction between said second contact pad and said second contact surface, it will be seen when considering the prior art that a technical problem resides in designing the flexible element so as to exhibit an adapted low bending resistance while the device exhibits totally an adapted high thermal conductance.

Another technical problem is one of realizing how a thermally conductive device shall be designed in order to enable it to bend or curve in response to variations in the distance between the first and the second bodies, such as variations due to temperature variations or varying component heights.

It will also be seen that a technical problem resides in providing a thermally conductive device of very simple construction that is able to solve these technical problems.

Still another technical problem resides in realizing the advantages that are associated with a device in which each bendable region in said bendable element is allocated a specific bending resistance and a specific thermal conductance.

It will also be seen that a technical problem resides in realizing the possibilities that are afforded by providing a bendable region with a bending resistance and/or a thermal conductance that differs from the bending resistance and/or the thermal conductance of one or more other bendable regions.

Another technical problem is one of realizing the manufacturing/technical advantages that are afforded when the device is comprised of a bar in which respective bendable regions are comprised of respective material-thinning grooves.

Still another technical problem is one of being able to adapt the dimensions of a bar and the material-thinning grooves provide therein in a manner to obtain a predetermined low bending resistance in each bendable region and a predetermined high thermal conductance in respect of said thermally conductive device.

Yet another technical problem is one of realizing the manufacturing advantages that are obtained when the device is comprised of plates and the bendable regions are comprised of foil bridges.

It will also be seen that a technical problem is one of realizing the significance of adapting the dimensions of plates and foil bridges that are used and the distance between two mutually adjacent plates such as to obtain a predetermined low bending resistance in each bendable region and a predetermined high thermal conductance in respect of the thermally conductive device.

It will also be seen that a technical problem resides in realizing the conditions required to prevent adjacent legs from contacting one another as bending occurs in said bendable region, when using a material-thinning groove or a foil bridge in said bendable region.

It will also be seen that a technical problem is one of realizing how the thermal conductance can be increased with the use of thicker material without at the same time increasing the bending resistance by a cubic ratio to thickness, irrespective of which embodiment of the present invention is used.

SOLUTION

With the intention of solving one or more of the aforesaid technical problems, the present invention takes as its starting point a thermally conductive device which is operable for establishing mechanical and thermal contact between a first body, such as an electric and/or electronic circuit, and a second body, such as a cooling body, with the intention of smoothing-out temperature gradients that occur between the first and the second body, by conducting heat from the first body to the second body or vice versa.

The device includes a first and a second contact pad and a resilient element acting therebetween.

The first contact pad is adapted for coaction with a first contact surface belonging to the first body, the second contact pad is adapted for coaction with a second contact surface belonging to the second body, wherein the two bodies are mutually positioned so that the two contact surfaces face towards one another, and wherein the resilient element is adapted to exert on the first and the second contact pads a predetermined pad-separating force that urges said pads against respective first and second bodies.

With a starting point from this device, the present invention proposes that the resilient element includes at least one bent region that has a bending resistance which is representative of said predetermined force, that said region or parts that are proximate to said region have a thermal conductance which is slightly lower than the thermal conductance of the region adjacent to said region proximate parts.

With the intention of obtaining a resilient element that has an adapted high thermal conductance and an adapted low bending resistance, it is proposed in accordance with the invention that the resilient element will include at least one resilient configuration that includes a first and a second leg, wherein a first end of the first leg is connected to the first contact pad through the medium of a first bent region, a second end of the second leg is connected to the second contact pad through the medium of a second bent region, and a second end of the first leg is connected to a first end of the second leg through the medium of a third bent region.

The device can be made compressible and expandable with the aid of a resilient element that includes two resilient configurations that are positioned so that all third bent regions of respective resilient configurations will face towards one another.

A simple way of obtaining a bent region of adapted low bending resistance and high thermal conductance that is slightly higher than the thermal conductance of the peripheral regions, is to allow respective bent regions to be comprised of a material-thinning groove in which bending can take place.

This enables the device to be comprised of a single bar that includes a plurality of material-thinning grooves, thereby enabling the bar to bend or curve in said grooves and therewith form the first and the second contact pads and the resilient element.

It is proposed in accordance with the invention that the bar shall have a material thickness of 0.2 to 1.0 mm, preferably 0.4 to 0.6 mm, and that the material-thinning groove shall have a material thickness of 0.01 to 0.5 mm, preferably 0.05 to 0.15 mm, and that the width of the groove shall be from 0.4 to 4 mm, preferably 0.8 to 1.2 mm. It will be understood that these sizes are convenient sizes and are given solely by way of example.

In order to enable the device to provide good thermal contact with an adapted low contact force even when the first and the second body are positioned obliquely to one another, respective first and second legs may be provided with a material-thinning groove that extends from the first end to the second end diagonally over respective legs, meeting each other at the third bent region common to the first and the second leg.

A bent region that has an adapted low bending resistance and a high thermal conductance, which is slightly higher than the thermal conductance of the peripheral regions, can alternatively be obtained by forming the first and the second contact pads and the first and the second legs within respective resilient configurations from plates forming the bent regions from foil bridges that are bent between the plates, thereby forming the device.

In accordance with the invention, the plates may have a material thickness of 0.2 to 1.0 mm, preferably 0.4 to 0.6 mm, and the foil bridges may have a material thickness of 0.01 to 0.5 mm, preferably 0.05 to 0.15 mm, and the distance between two adjacent plates may be 0.4 to 4 mm, preferably 0.8 to 1.2 mm. It will be understood that these dimensions are convenient dimensions and have been given solely by way of example.

This embodiment also enables the device to establish good thermal contact with an adapted low contact force even when the first and the second bodies are positioned obliquely in relation to one another, by virtue of the fact that the plates, which form respective first and second legs, are divided in two from their first end to their second end diagonally across respective legs, wherein said divisions meet one another at the third bent region common to said first and said second legs, and wherein respective two-part plates are held together by a foil bridge or tie.

The plates may be either glued or soldered to the foil bridge, for instance.

In order to obtain a high thermal conductance, the materials used in the bar, plates or foil will conveniently possess a high thermal conductance and a high modulus of elasticity, such as aluminum, copper or silver.

In accordance with the invention, bent regions and other parts shall be dimensioned so that the final device will have a total bending resistance that enables the resilient element to be compressed to an extent corresponding to 1 mm, preferably 0.4 to 0.8 mm, in response to an applied force that corresponds to about 1 N, and so that the total thermal conductance will be in the order of 5 to 15° C./W, preferably about 10° C./W for components that develop a power in the region of 1 W, and so that the combined force exerted by a number of devices will not detrimentally influence the cooling body or the circuit board to which the various components are connected.

An inventive device may be used when the first body is an electric component, such as an integrated circuit mounted on a cassette-enclosed circuit board, wherein the cassette is comprised of a bottom part and a cover member and wherein the second body is comprised of said cover member.

With the intention of enabling and simplifying mounting of one or more thermally conductive devices between one or more components within a cassette and the cassette cover, it is proposed in accordance with the invention that the mechanical contact between the second contact pad and the cover is achieved through the medium of a mechanically fixed and thermally conductive contact. This enables the cover member to be lifted to provide access to the circuit board and its components with the thermally conductive devices remaining seated on the cover member.

The fixed mechanical contact may be implemented by soldering or gluing.

Further suitable embodiments of the present invention that solve some of the aforesaid technical problems are achieved on the basis of a thermally conductive device intended for establishing mechanical and thermal contact between a first body, such as an electric and/or electronic circuit, and a second body, such as a cooling body, with the intention of smoothing-out a temperature gradient occurring between the first and the second body.

The device includes a first and a second contact pad and a bendable element acting therebetween, wherein the first contact pad is adapted for coaction with a first contact surface belonging to the first body, the second contact pad is adapted for coaction with a second contact surface belonging to the second body, and wherein the bodies are positioned relative to one another such that the two contact surfaces will face essentially in mutually the same direction.

The bendable element is adapted to afford relative perpendicular movement between the first and the second contact surfaces while maintaining coaction between the first contact pad and the first contact surface and between the second contact pad and the second contact surface.

It is proposed in accordance with the invention that in respect of a device of this kind, the resiliently bendable element shall have at least one bendable region that has an adapted bending resistance.

This region or parts in the close proximity thereof are given a thermal conductance that is slightly higher than the thermal conductance of regions that lie adjacent to the region-proximate parts.

The resilient element includes at least one leg, wherein a first end of said leg is connected to the first contact pad through the medium of a first bendable region, and a second end of said leg is connected to the second contact pad through the medium of a second bendable region.

It is also proposed in accordance with the invention that the first bendable region may have a bending resistance and/or a thermal conductance that differs from the bending resistance and/or thermal conductance of the second bendable region.

In one embodiment of the invention, respective bendable regions are comprised of a material-thinning groove.

The device may conveniently be comprised of a single bar that includes a plurality of material-thinning grooves.

According to the invention, the bar may have a material thickness of 0.2 to 1.0 mm, preferably 0.4 to 0.6 mm, the material-thinning groove may have a material thickness of 0.01 to 0.5 mm, preferably 0.05 to 0.15 mm, and the width of the material-thinning groove may have a width of 0.4 to 4 mm, preferably 0.8 to 1.2 mm. It will be understood that these dimensions are convenient dimensions and are given solely by way of example.

In order to enable the thermally conductive device to compensate for different disparities in the parallelism between the two bodies, it is proposed in accordance with the invention that the leg is provided with a material-thinning groove that extends from the first end to the second end of said diagonally across the leg.

The device may also conveniently be comprised of plates and one or more foils bridges or ties, wherein the first and the second contact pads and said legs are comprised of plates, and respective bendable regions are comprised of foil bridges or ties.

It is proposed in accordance with the invention that the plates will have a material thickness of 0.2 to 1.0 mm, preferably 0.4 to 0.6 mm, that the foil bridges will have a material thickness of 0.01 to 0.5 mm, preferably 0.05 to 0.15 mm, and that the distance between two mutually adjacent plates will be 0.4 to 4 mm, preferably 0.8 to 1.2 mm. It will be understood that these dimensions are convenient dimensions and that they have been given solely by way of example.

The device can also in this case be adapted to compensate for disparities in parallelism, by dividing the leg-forming plate into two parts from the first end to the second end diagonally across the leg, said two-part plate being held together by a foil bridge or tie.

A device of the aforedescribed kind is particularly useful when the first body is a circuit board mounted electric component, such as an integrated circuit, and when the second body is a cooling body, such as a cooling flange, that is mounted in the proximity of or on a circuit board.

According to one embodiment of the invention, the mechanical contact between the first contact pad and the first body is a mechanically fixed and thermally conductive contact, and the mechanical contact between the second contact pad and the second body is a slidable mechanical and thermally conductive contact.

With the aim of enabling at least the thermal conductance of a device to be increased without, at the same time, increasing the bending resistance by more than the same extent to which the thermal conductance is increased, it is proposed that a plurality of parts of the device, or a plurality of devices, shall be connected in parallel as an alternative to increasing the thickness of the material in the thinning region.

ADVANTAGES

Those advantages that are primarily characteristic of an inventive thermally conductive device reside in enabling the provision, in a simple manner, of a device that achieves between a hot and a cooling body a mechanical and flexible thermal contact with an adapted thermal conductance and an adapted contact force, thereby enabling heat to be transferred effectively from the hot body, which may comprise circuit board mounted electric and/or electronic components, to the cooling body without heating the circuit board or adjacent components and without the force acting between a number of components and the cooling body having a detrimental effect on either the cooling body or the circuit board.

The main characteristic features of an inventive thermally conductive device are set forth in the characterizing clause of the following Claim 1 and also in the characterizing clause of the following Claim 28.

BRIEF DESCRIPTION OF THE DRAWINGS

A number of exemplifying embodiments of thermally conductive devices having properties that are significant to the present invention will now be described in more detail with reference to the accompanying drawings, in which.

DETAILED DESCRIPTION OF EMBODIMENTS AT PRESENT PREFERRED

Figure 1:
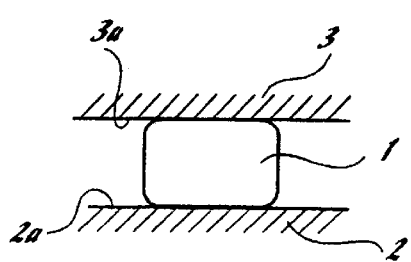
FIG. 1 illustrates schematically the transfer of heat from a hot body to a cold body through the medium of a thermally conductive device.

FIG. 1 is a highly schematic illustration that shows how heat from a hot body 2 is transferred from the hot body to a cold body 3 through the medium of a thermally conductive device 1. The thermally conductive device has a certain thermal conductance between the hot and the cold bodies, which, expressed simply, is given by the thermal resistivity of the material from which the device is made, the dimensions of this material, and the thermal contact between the device 1 and the respective hot and cold bodies 2, 3.

In order to achieve the highest possible thermal conductance between the hot and the cold body 2, 3, it is endeavored to find a device that will provide a high thermal conductance while also achieving good thermal contact with respective hot and cold bodies.

The thermally conductive device of the FIG. 1 embodiment acts between two contact surfaces, a first contact surface 2a belonging to the first body 2, and a second contact surface 3a belonging to the second body. The two bodies 2, 3 are positioned in relation to one another so that the two contact surfaces 2a, 3a face towards each other.

For good thermal contact, the device 1 may be fixedly connected to respective bodies 2, 3, fixedly connected to only one body, or loosely clamped between the two bodies.

When the device 1 is fixedly connected to only one body or is clamped between the two bodies 2, 3, it is necessary for the device 1 to act with a given mechanical force between said two bodies 2, 3 in order to achieve good mechanical and therewith good thermal contact.

The present invention is based on a thermally conductive device 1 that is either fixedly connected to solely one body or is clamped firmly between said two bodies 2, 3.

Such is often the case when the hot body 2 is comprised of an electric and/or an electronic component and the cold body 3 is comprised of a cooling flange or of a part of a casing positioned immediately thereabove but not in mechanical contact with said component, so as to enable ready access to the component for servicing or test measuring purposes, for instance.

Figure 2:
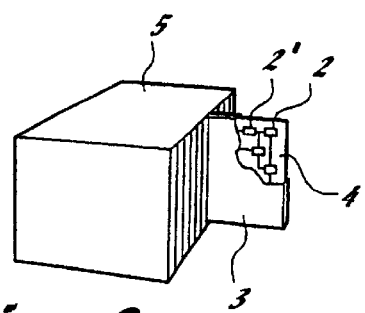
FIG. 2 illustrates in perspective a frame that carries a plurality of cassettes, of which one is shown in a partially broken view, and a circuit board mounted in this cassette.

FIG. 2 illustrates a plurality of hot bodies 2 in the form of electric and/or electronic components 2, 2' connected to a circuit board 4.

It is normal to mount a large number of circuit boards in a stand or frame 5, where respective circuit boards 4 are mounted in a cassette 3 that functions as a cold body 3.

The purpose of a cassette 3 is to prevent the spread of electromagnetic disturbances and to protect against incoming electromagnetic disturbances, moisture, dirt, grease, dust and other contaminants.

Figure 3:
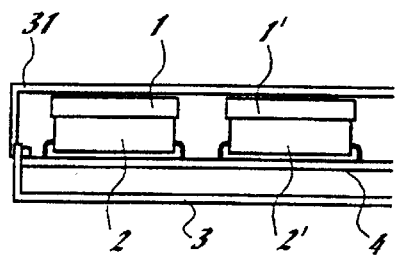
FIG. 3 is a side view and sectional view of a cassette that includes a circuit board and a number of components connected thereto.

Components 2 that develop heat and that are fully enclosed in this way need to be cooled. The cooling of cassette enclosed components is relatively difficult to achieve. A natural method in this regard is to conduct the heat from the components 2, 2' to the cassette casing 31 in accordance with the FIG. 3 embodiment.

This will result, however, in heating of the cassette, which then needs to be cooled. Cooling of the cassette can be achieved by providing between the cassettes gaps in which a coolant, normally air, is allowed to circulate, or by mounting cooling bodies on the frame surfaces and/or on the free end-wall of the cassette.

For the purpose of conducting heat from a component 2 to the cassette casing 31, it is normal to fill the air gap located between a component 2 in the casing 31 with some type of thermally conductive device 1.

Because a circuit board 4 is able to carry a large number of components 2, 2', there is a need to use a large number of thermally conductive devices 1, 1' which are each able to apply between the component 2 and the casing 31 a force that will establish good mechanical and good thermal contact between the device, component and casing respectively.

A large number of components 2, 2' will often be mounted on a circuit board 4, and when several of these components need to be provided with a thermally conductive device 1, 1', the combined force exerted by said devices against said components may be so great as to result in deformation of the circuit board 4. For instance, this combined force may result in damage to components, fracturing of circuit board conductor parts or in damage to the solder with which the component contacts are affixed to the circuit board. The fastenings of surface-mounted components are particularly sensitive in this regard.

Because the cassette walls are often very thin, in the order of 1 mm, and are made of soft material, aluminum, the combined force from the thermally conductive devices 1, 1' may result in deformation of the cassette casing 31, cause the casing to bulge, which may mean in the worst case that the cassette 3 will not fit into its intended place in the frame 5.

The object of the present invention is to provide a mechanically flexible thermal contact between a hot body and a cold body through the medium of a contact element that has a small contact force and that is able to conduct heat away from components that develop heat in the order of 1 W.

In principle, there is nothing to prevent the present invention being used for cooling components that develop more heat than components in the order of 1 W. Such a device, however, would require totally different dimensions to those recited in this specification.

With the intention of providing a device that will generate a small contact force, the present invention is based on the understanding of the bending resistance and the thermal conductance that is afforded by a bar that is securely fixed at one end.

FIG. 4A illustrates a rod B that is securely fixed at one end B1 and with which a force $F_B$ is applied to the other end B2 of the rod in a direction perpendicular to the longitudinal axis of the rod. It is assumed that heat transfer takes place from the end B2 of the rod to its end B1. The rod has a height or vertical dimension "h".

In order to obtain the greatest possible downward bending of the rod with a small force at said other end B2, the rod B may be thinned locally at a point "p", as shown in FIG. 4B. This weakens the rod and pronounced downward bending of the rod will occur in response to an applied force $F_B$.

In order to ensure that the rod will bend or curve downwards to the greatest possible extent in relation to the size of the thinning, the thinning is suitably positioned at a place on the rod B that takes-up the greatest moment of force when the force $F_B$ is applied. This greatest moment of force is found in the first end B1 at the rod attachment, and hence it is appropriate to thin the rod at this position, in accordance with FIG. 4C.

The thinned region also results in a lower thermal conductance.

This detrimental effect of the thinned region on the thermal conductance can be reduced by making the thinned region as short as possible in the direction of the longitudinal axis of the rod and/or the height h' of the rod can be increased, wherewith the thermal conductance of the non-thinned parts of the rod will be higher than the thinned parts. These measures reduce the detrimental effect on the total thermal resistance of the rod.

The bending resistance of the rod is proportional to the height "h" raised to a power of three ($h^3$), meaning that an increase in the height "h" by a factor of two will increase the thermal conductivity by a factor of two and increase the bending resistance by a factor of eight ($2^3$).

It will be apparent to the person skilled in this art that an excessively thin region will result in a much too weak construction and an excessively low thermal conductance. A predetermined bending resistance and a predetermined thermal conductance can be obtained in respect of the rod, by adapting the thickness of the thinned region and also its length extension.

The bending resistance and the thermal conductance of a thinned region are mutually connected. In simple terms, it can be said that the thermal conductance is proportional to the bending resistance.

Figure 5:
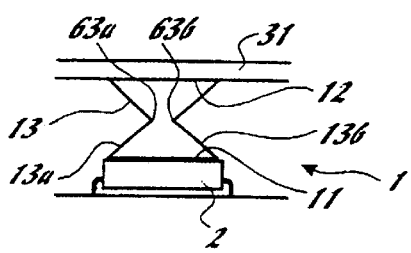
FIG. 5 is a side view of a thermally conductive device that is operative between a first and a second body.

FIG. 5 illustrates a proposed embodiment which is based on these theories. Thus, FIG. 5 illustrates a thermally conductive device 1 which includes a first and a second contact pad 11, 12 and a resilient element 13 located therebetween. The first contact pad 11 is adapted for coaction with a first body 2, the second contact pad 12 is adapted for coaction with a second body 31, and the resilient element 13 is adapted to exert on the first and the second contact pad a predetermined pad-separating force for effective contact with respective first and second bodies and therewith effective transfer of heat from the first to the second body.

Figure 6:
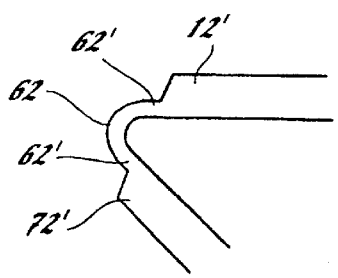
FIG. 6 is a detailed illustration of the distribution of different regions in and around a bent region.

As illustrated in FIG. 6, the resilient element 13 includes at least one bent region 62 that has a bending resistance which is representative of the predetermined force. The region 62 or region-proximate parts 62' has or have a thermal conductance which is slightly lower than the thermal conductance of the regions 12', 72' located adjacent the region-proximate parts 62'.

The bent region 62 and the region-proximate parts 62' have a much smaller bending resistance than the regions 12', 72' adjacent the region-proximate parts 62', meaning that any bending caused by an applied force will occur in this region.

Figure 7:
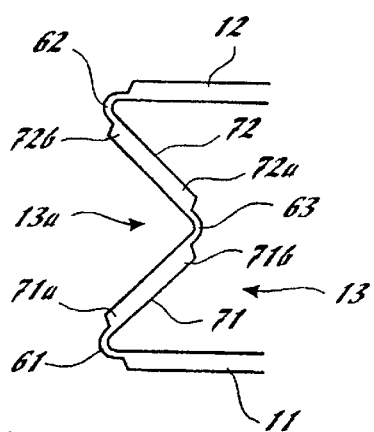
FIG. 7 is a schematic illustration of the construction of a resilient configuration.

FIG. 7 illustrates a resilient element which may include at least one resilient configuration 13a. The illustrated resilient configuration includes a first and a second leg 71, 72, wherein a first end 71a of the first leg 71 is connected to the first contact pad 11 through the medium of a first bent region 61, a second end 72b of the second leg 72 is connected to the second contact pad 12 via a second bent region 62, and a second end 71b of the first leg 71 is connected to a first end 72a of the second leg 72 via a third bent region 63.

There is thus obtained a resilient element 13a that includes three bent regions 61, 62, 63 that together answer for the total bending resistance of the resilient configuration.

There is nothing to prevent a bent region being given a bending resistance, and therewith also a thermal conductance, that differs from the bending resistance and the thermal conductance of one or more other bent regions.

This enables the construction of a resilient configuration that has a predetermined total bending resistance and a predetermined thermal conductance.

Referring back to FIG. 5, there is shown a proposed embodiment of a thermally conductive device 1 whose resilient element 13 is comprised of two resilient configurations 13a, 13b, wherein respective configurations are so positioned in relation to one another that the third bent regions 63a, 63b of respective resilient configurations will be directed towards one another, in between the first and the second contact pads 11, 12.

A region whose bending resistance is lower than the bending resistance of peripheral regions can be achieved in many different ways.

Figure 8:
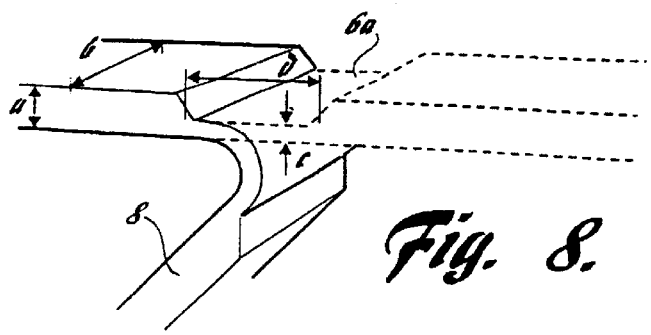
FIG. 8 illustrates in perspective one possible embodiment of a bent region.

For instance, FIG. 8 illustrates an embodiment in which respective regions are comprised of a material-thinning groove 6a and respective bent regions have the form of permanent bends.

Figure 9:
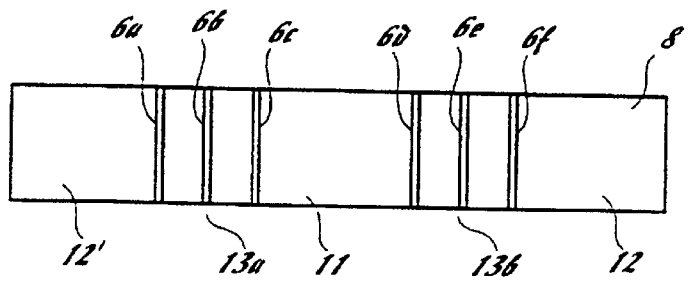
FIG. 9 illustrates in a simplified fashion the manner in which a thermally conductive device can be formed from a bar.

As evident from FIG. 9, such an embodiment can be implemented by constructing the device from one single bar 8 which includes a plurality of material-thinning grooves 6a, 6b, . . . , 6f. The bar 8 can be permanently bent in the grooves to form the first and the second contact pad 11, 12 and the resilient configurations 13a, 13b.

The grooves may be milled or pressed in the bar, for instance.

Figure 10:
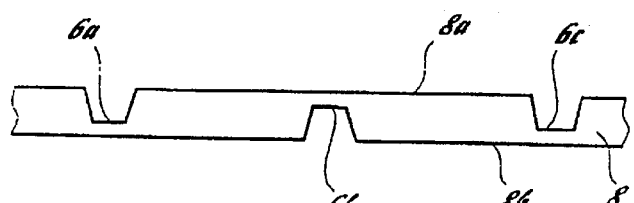
FIG. 10 illustrates possible distributions of material-thinning grooves along a bar.
Figure 11:
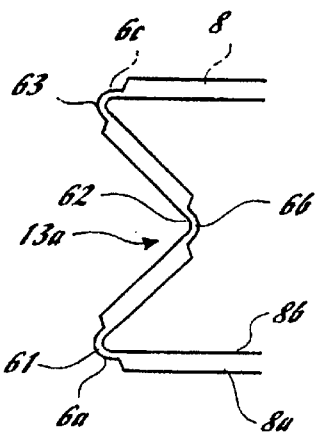
FIG. 11 illustrates part of a permanently bent bar that includes material-thinning grooves according to FIG. 10.

In order to avoid two mutually adjacent legs coming into contact with one another as a result of bending in a material-thinning groove, and preventing further compression of the thermally conductive device, there is shown in FIGS. 10 and 11 an embodiment of a resilient configuration 13a in which the first and the second bent regions 61, 62 are comprised of a material-thinning groove 6a, 6c that is provided on a first side 8a of the bar 8, and in which the third bent region 63 is comprised of a material-thinning groove 6b on a second side 8b of the bar 8. FIG. 10 illustrates the positions of the material-thinning grooves 6a,6b,6c on the bar 8, and FIG. 11 illustrates part of a device that includes a contact pad according to FIG. 10.

In respect of a device according to the FIG. 8 embodiment, the bar may have a material thickness "a" in the order of 0.2 to 1.0 mm, preferably 0.4 to 0.6 mm, the material-thinning grooves may have a material thickness "c" in the order of 0.01 to 0.5 mm, preferably 0.05 to 0.15 mm, and the material-thinning grooves may have a width "d" that corresponds to 0.4 to 4 mm, preferably 0.8 to 1.2 mm.

The bar regions that are to constitute the bent regions may be orientated in the bar so that the bar extremities will be spliced together in different ways when constructing the device.

Figure 12:
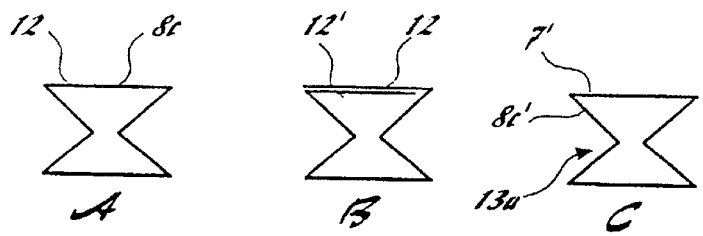
FIGS. 12A, 12B and 12C illustrate in a simplified fashion a plurality of different possible splicing points on a bar in the construction of a thermally conductive device.

FIG. 12A shows an embodiment in which the splice 8c is placed in the centre of the second contact pad 12, FIG. 12B shows an embodiment in which each end of the plate 8 has a size which corresponds to the size of the second contact pad 12 and where said end 12' and said pad 12 are superimposed, and FIG. 12C illustrates an embodiment in which the splice 8c' is placed in the centre of one leg 72 of one of the resilient configurations 13a.

Figure 13:
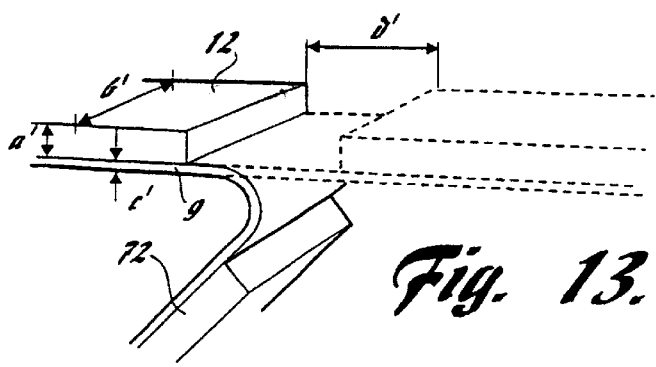
FIG. 13 illustrates in perspective another possible embodiment of a bent region.
Figure 14:
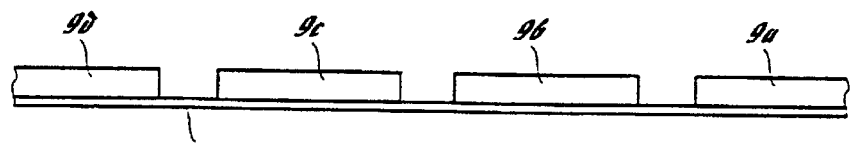
FIG. 14 illustrates in simple fashion the manner in which a device can be formed from a plurality of plates and a foil bridge or tie.

FIGS. 13 and 14 illustrate an embodiment in which one bent region has a smaller bending resistance than its peripheral regions. This has been achieved by constructing the first and the second contact pads 11, 12 and the first and the second legs 71, 72 in respective resilient configurations from plates 9a, 9b, . . . , 9f, and by constructing the bent regions from foil bridges or ties 9, with respective foil bridges being bent or curved between the plates such as to form said thermally conductive device.

In respect of a device according to this embodiment, the plates may have a material thickness "a'" in the order of 0.2 to 1.0 mm, preferably 0.4 to 0.6 mm, the foil 9 may have a material thickness "c'" in the order of 0.01 to 0.5 mm, preferably 0.05 to 0.15 mm, and the distance "d'" between two adjacent plates may be 0.4 to 4 mm, preferably 0.8 to 1.2 mm.

The plates 9a, 9b, . . . , 9f may be fastened to the foil 9 as by gluing or soldering, for instance.

Figure 15:
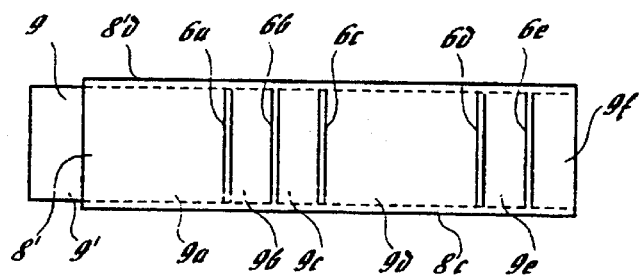
FIG. 15 illustrates the manner in which a length-adapted foil tie is able to bind a number of plates together.

The plates 9a, 9b, . . . , 9f may conveniently be formed from a bar 8' in which slots 6a, 6b, . . . , 6e have been punched, in accordance with FIG. 15, and a foil bridge or tie 9 fastened to one side of the plate 8'. Subsequent to fastening the foil bridge, the side parts 8'c, 8'd of the bar are punched or stamped-out, so as to leave solely individual plates 9a, 9b, . . . , 9f, these plates being interconnected by the foil bridge or tie 9.

It is also possible to use individual plates of adapted size and apply these plates to a foil bridge or tie.

In the embodiment illustrated in FIG. 15, the foil bridge or tie 9 is conveniently somewhat longer 9' than the total length of the plates and the adapted spacing therebetween, so as to overlap slightly when assembling the device.

A further simplified method of constructing a device with the aid of foil bridge or tie would be to use a foil bridge that has an adhesive side, such as a pre-glued side.

Figure 16:
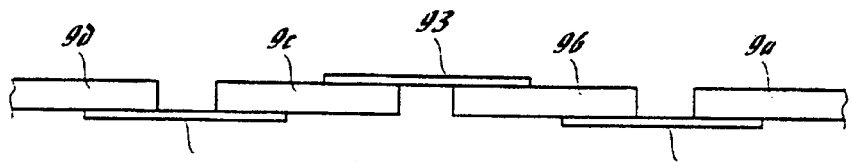
FIG. 16 illustrates a possible foil-tie distribution between plates.
Figure 17:
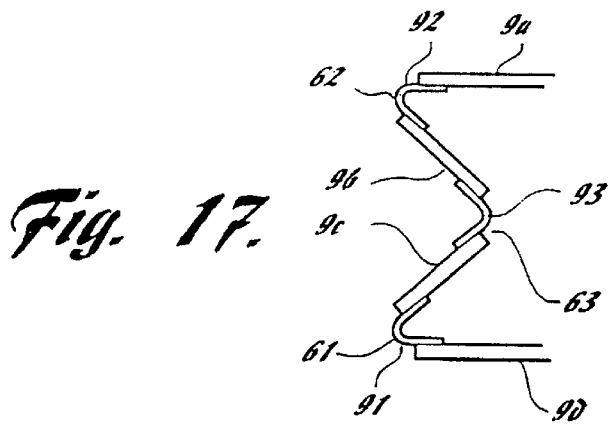
FIG. 17 illustrates part of an arrangement comprising plates and foil ties according to FIG. 16.

In order to prevent two mutually adjacent plates coming into contact with one another on a bending occasion and further compression of the thermally conductive device, FIGS. 16 and 17 illustrate an embodiment of a resilient configuration 13a in which the first and the second bent regions 61, 62 are comprised of a foil tie 91, 92 which holds together adjacent plates 9a, 9b; 9c, 9d on a first side of the plates, and in which the third region 63 is comprised of a foil tie 93 which holds together adjacent plates 9b, 9c on a second side of said plates.

It is not unusual that parallelism between the hot and the cold body will deviate to some extent, such as between a component and a cassette casing. In order to obtain good thermal contact and a desired high thermal conductance, it is important that no air wedges are present between the heat conducting device and the hot or the cold body. The thermally conductive device is able to compensate for certain deviations in parallelism between the two bodies, but not for all types of deviations and not for deviations of all magnitudes.

Figure 18:
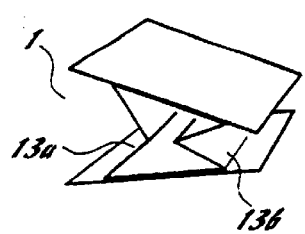
FIG. 18 illustrates schematically a first type of deviation in parallelism between two bodies.

FIG. 18 illustrates the type of deviation in parallelism that causes one resilient configuration 13B to be compressed to a greater extent than the other resilient configuration 13a. This type of deviation can be readily compensated for by the thermally conductive device 1.

Figure 19:
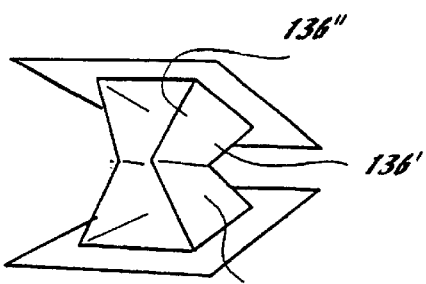
FIG. 19 illustrates schematically a second type of deviation in parallelism between two bodies.

FIG. 19 illustrates another type of deviation in parallelism that requires an individual resilient configuration 13b to be compressed to a greater extent at its viewerdistal end 13b' than at its viewer-proximal end 13b". Only a small degree of compensation can be made for this type of deviation in parallelism, without adapting the device particularly for this purpose.

It will be understood that the deviations in parallelism between a first and a second body illustrated in FIGS. 18 and 19 have been greatly exaggerated with the intention of illustrating the types of deviations that can occur in this respect.

It will be evident to the person skilled in this art that a deviation in parallelism between the first and the second body will not have the cultivated form of the deviation illustrated in FIG. 18 or the deviation illustrated in FIG. 19, but will normally be comprised of a combination of the two deviations illustrated in the Figures, wherein one such deviation may possibly be more pronounced than the other.

Figure 20:
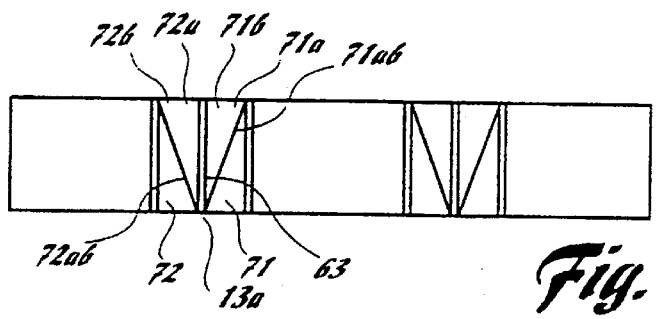
FIG. 20 illustrates a possible distribution of parts on a bar with the intention of compensating for deviation in parallelism between two bodies in accordance with FIGS. 18 and 19.

With the intention of enabling the thermally conductive device to compensate for deviations according to FIG. 19 to a great extent, there is proposed in accordance with the invention an embodiment according to FIG. 20, in which respective first and second legs 71, 72 of respective resilient configurations 13a have a partition 71ab, 72ab that extends from the first end 71a, 72a to the other end 71b, 72b, diagonally across respective legs 71, 72, where the two partitions 71ab, 72ab meet each other at the third bent region 63 that is common to the first and the second legs 71, 72.

The partitions 71ab, 72ab shall have a smaller bending resistance than the peripheral leg regions. This may be achieved with the aid of a material-thinning groove or by spacing apart two pads or plates and holding the pads or plates together with the aid of a foil bridge or tie, as described above with reference to the manner in which the bent regions can be implemented, with the exception that these partitions 71ab, 72ab are not bent.

The partitions 71ab, 72ab enable respective legs 71, 72 to fold or give way and therewith take up the type of deviation in parallelism between the first and the second body shown in FIG. 19.

The materials from which an inventive thermally conductive device is manufactured will preferably be such as to provide the largest possible difference between thermal conductivity and elasticity modulus, so as to obtain a desired high thermal conductance and a low bending resistance in the respective bent regions. Other parameters are, of course, material costs, wherein materials that have the aforesaid properties but are extremely expensive will nevertheless not be suitable because of their high price, such as noble materials, e.g. gold.

Suitable materials in this respect are metals that have a high thermal conductance, such as aluminum, copper or silver. There is nothing to prevent different parts of the device from being comprised of different materials. For instance, the plates 9a, 9b, . . . , 9f in the FIG. 13 embodiment may be comprised of copper and the foil bridge or tie 9 comprised of silver.

It will be obvious to the person skilled in this art that the inventive device will preferably be fabricated from material that possesses a high thermal conductance, most preferably copper, and the earlier reference to copper, aluminum and silver also includes alloys of different materials in which copper, aluminum and silver are the main constituents.

A possible combination that does not include metals is a thermally conductive device moulded from plastic material and having a low bending resistance in the bent regions and which is reinforced with carbon fibre, which has a very low thermal resistivity.

The object of one specific embodiment of the present invention is to provide a thermally conductive device that has the following properties: The included bent regions have a total bending resistance that will result in the compression of an included resilient element of 1 mm, preferably of 0.4 to 0.8 mm, in response to an applied force of about 1 N and the total thermal conductance of which is in the order of 5 to 15° C./W, preferably about 10° C./W.

It will be evident that a thermally conductive device may include one or more bent regions in accordance with the FIG. 8 embodiment, or one or more bent regions in accordance with the FIG. 13 embodiment.

For the sake of simplicity, the aforesaid embodiments have included thermally conductive devices that have two resilient configurations.

Figure 21:
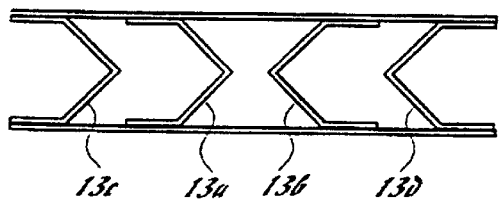
FIG. 21 is a side view of a device that includes four resilient configurations.

However, there is nothing to prevent a thermally conductive device including a plurality of resilient configurations 13a, 13b, 13c, 13e, as shown in FIG. 21. This embodiment enables the thermal conductance to be increased without, at the same time, increasing the bending resistance more than necessary, since an individual thinned region that increases its thickness by a factor of two also increases its bending resistance by a factor of eight. On the other hand, the bending resistance is increased solely by a factor of two when two parallel resilient elements replace a single resilient element.

Figure 22:
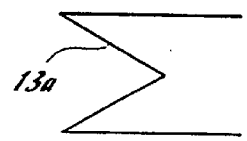
FIG. 22 is a side view of a device that includes only one resilient configuration.

As evident from FIG. 22, a thermally conductive device may include solely one resilient configuration 13a.

Circuit boards 4 carrying components 2, 2' that, according to FIG. 2, are mounted in a cassette 3 that, in turn, is inserted into a frame 5 together with other cassettes, sometimes requires inspection and/or service. It is important that the circuit board 4 can be easily reached in such circumstances, and that the cassette 3 can be readily reclosed when the inspection or service is terminated.

A circuit board 4 may carry a plurality of components 2, 2' that are cooled in accordance with the present invention, and consequently it is necessary to fixedly fasten the thermally conductive devices to one of the two bodies 2, 31. This solution enables a cassette to be readily opened and reclosed while maintaining the positions of the thermally conductive devices 1, 1' between the components and the cassette casing.

Turning back to FIG. 5, it will be seen that the mechanical contact between the second contact pad 12 and the second body 31 is comprised of a mechanically fixed and thermally conductive contact.

This means that all thermally conductive devices 1 have a respective fixed position in the cassette casing 31. and will always be positioned correctly over a component 2 when mounting in a cassette 3 a circuit board 4 that has a specific combination of components.

This fixed mechanical contact may be achieved by soldering or gluing, for instance.

In the aforedescribed embodiments, the first and the second body are positioned in relation to one another such that the contact surfaces that coact with which the thermally conductive device face towards one another.

Figure 23:
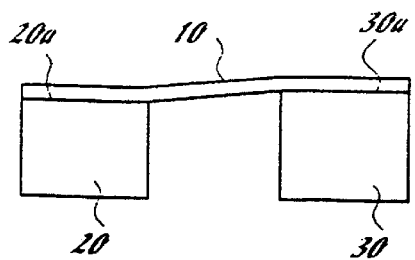
FIG. 23 illustrates schematically possible transfer of heat from one body to another body through the medium of a thermally conductive device.

FIG. 23 illustrates an embodiment which shows that applications arise in which this is not the case. For instance, it is not unusual for a first body 20, such an electric and/or electronic component, to be positioned relative to another body 30, such as a cooling flange, such that the two contact surfaces, a first contact surface 28 belonging to the first body 20 and a second contact surface 30a belonging to the second body 30 do not face towards one another but in one and the same direction, for instance.

This application requires a thermally conductive device 10 that is able to coact with the two contact surfaces 20a, 30a.

Figure 24:
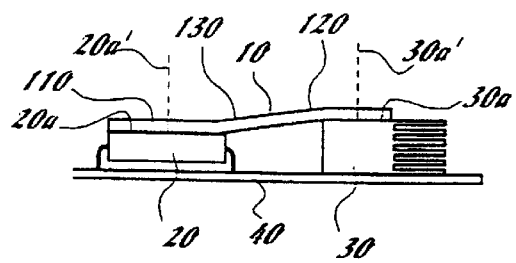
FIG. 24 is a side view of a thermally conductive device in coaction with a first and a second body.

A proposed embodiment of the invention adapted to this end is shown in FIG. 24. This Figure illustrates a thermally conductive device 10 that includes a first contact pad 110 which is adapted for coaction with a first contact surface 20a belonging to a first body 20, such as an electric and/or an electronic component that is fixed to a circuit board 40, a second contact pad 120 which is adapted for coaction with a second contact surface 30a belonging to a second body 30, such as a cooling body, for instance a cooling flange positioned in the proximity of or on the circuit board 40, and a resiliently bendable element 130 that acts therebetween.

In the case of variations in the size of said bodies due to variations in temperature and due to differing manufacturing tolerances in the manufacture of the bodies, it is important that the bendable element 130 is able to bend so as to allow relative perpendicular movement between the first and the second contact surfaces 20a, 30a while maintaining the coaction between the first contact pad 110 and the first contact surface 20a, and between the second contact pad 120 and the second contact surface 30a.

By relative perpendicular movement is meant a first movement of the first contact surface relative to a normal to the first contact surface and/or a second movement of the second contact surface relative to a normal to the second contact surface, where the first movement is not of the same magnitude, nor necessarily in the same direction, as the second movement.

In order to prevent the occurrence of stresses in one or both bodies 20, 30 and/or the supportive surface 40 on which they are mounted as a result of such movement, it is important that the bending resistance is adapted to a low value.

It is also important that the bendable element 130 has a high thermal conductance.

Figure 4:
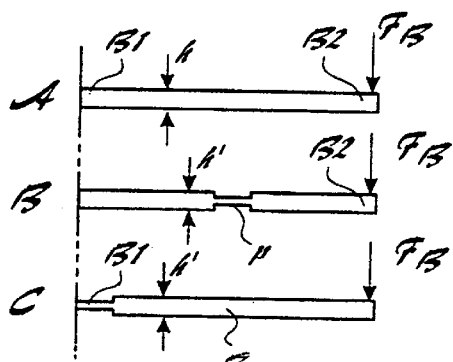
FIGS. 4A, 4B and 4C are schematic illustrations of different cases relating to the influence of a force on the free end of a rod whose other end is fixedly attached.

These criteria, a low bending resistance and a high thermal conductance, enable the theories presented with reference to FIG. 4 to be applied also in this case.

Figure 25:
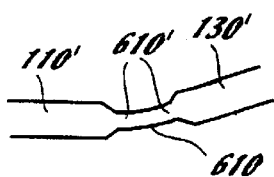
FIG. 25 is a detailed illustration of a bendable region with adjacent parts and regions.

As evident from FIG. 25, the thermally conductive device 10 of this embodiment shall include at least one bendable region 610 that has an adapted bending resistance and that the region 610 or region-proximate part 610' has a thermal conductance that is slightly higher than the thermal conductance of the regions 110', 170' located adjacent said region-proximate parts 610'.

Figure 26:
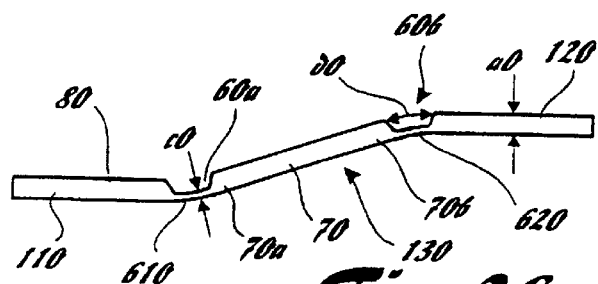
FIG. 26 illustrates a first embodiment of a thermally conductive device according to FIG. 23.

According to FIG. 26, the bendable element 130 includes at least one leg 70 and a first and a second bendable region 610, 620. A first end 70a of the leg 70 is connected to the first contact pad 110 via the first bendable region 610, and a second end 70b of the leg 70 is connected to the second contact pad 120 via the second bendable region 620.

Figure 27:
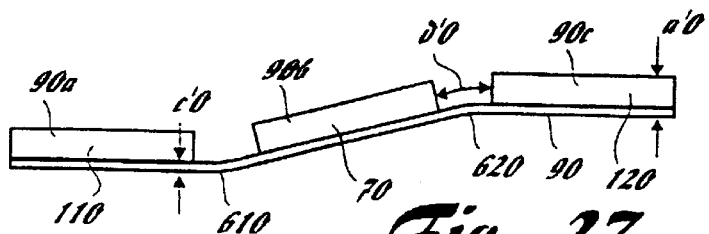
FIG. 27 illustrates a second embodiment of a thermally conductive device according to FIG. 23.

FIGS. 26 and 27 illustrate two different ways of obtaining bendable regions in accordance with the present invention. According to the embodiment illustrated in FIG. 26, respective bendable regions 610, 620 are comprised of respective material-thinning grooves 60a, 60b in a bar 80, while according to the embodiment illustrated in FIG. 27 respective bendable regions 610, 620 are comprised of a foil bridge or tie 90 and the contact pads 110, 120 and the leg 70 are comprised of respective plates 90a, 90b, 90c.

We shall not burden the description with further details of these embodiments, since they have been described earlier in conjunction with the description of the bent regions of previous embodiments.

However, it can be mentioned that the bar or respective plates may conveniently have a material thickness "a0", "a'0" in the order of 0.2 to 1.0 mm, preferably 0.4 to 0.6 mm, that the material-thinning grooves or the foil bridge or tie used may conveniently have a thickness of "c0", "c'0" in the order of 0.01 to 0.5 mm, preferably 0.05 to 0.15 mm, and the material-thinning grooves may conveniently have a width "d" of, or the distance between two adjacent plates "d'0" of 0.4 to 4 mm, preferably 0.8 to 1.2mm.

Figure 28:
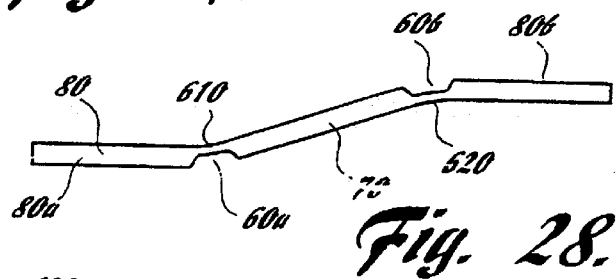
FIG. 28 illustrates a further embodiment of a thermally conductive device according to FIG. 26.

However, it will be obvious that in order to prevent joining together of a contact pad 110, 120 with the intermediate leg 70 when the bendable regions 610, 620 in FIG. 28 bend excessively, the first bendable region 610 shall be provided with a material-thinning groove 60a on a first side 80a of the bar 80 and the second bendable region 620 may be provided with a material-thinning groove 60b on a second side 80b of the bar 80.

Figure 29:
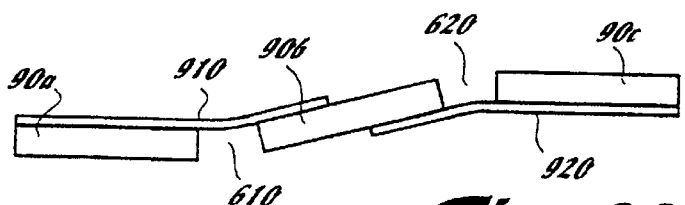
FIG. 29 illustrates a further embodiment of a thermally conductive device according to FIG. 27.

Correspondingly, as shown in FIG. 29, when the thermally conductive device is comprised of plates 90a, 90b, 90c and foil bridge or ties 910, 920, the first bendable region 610 is conveniently comprised of a foil bridge or tie 910 that holds together mutually adjacent plates 90a, 90b on a first side of respective plates and the second bendable region 620 may be comprised of a foil bridge or tie 920 that holds together mutually adjacent plates 90b, 90c on a second side of respective plates.

It is also necessary in the case of these embodiments that the thermally conductive device is able to maintain good thermal contact even in the event of errors in the parallelism between the two contact surfaces.

Figure 30:
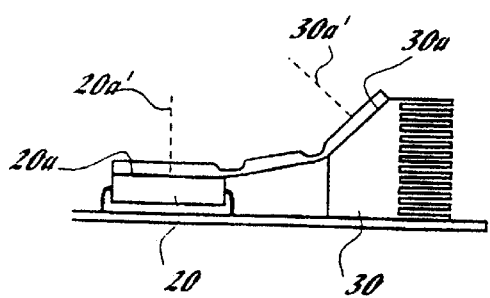
FIG. 30 illustrates schematically a first type of deviation in parallelism between two bodies.

It will readily be seen that errors in parallelism according to FIG. 30, where the normals 20a', 30a' to the two contact surfaces 20a, 30a may be included by a common plane, can be readily compensated for by an inventive thermally conductive device. There is nothing to indicate that this type of positioning of the bodies shall be understood as an error in parallelism, since it is quite possible that applications will occur in which the two contact surfaces have the directions shown in FIG. 30.

Figure 31:
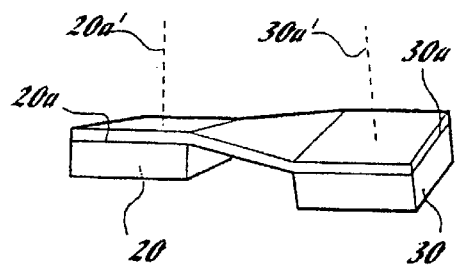
FIG. 31 illustrates schematically a second type of deviation in parallelism between two bodies.
Figure 32:
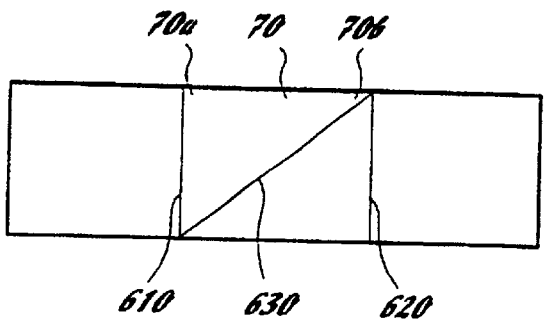
FIG. 32 illustrates a possible distribution of bendable partisions with the intention of compensating for a deviation in parallelism between two bodies in accordance with FIGS. 30 and 31.

A deviation in parallelism of the kind illustrated in FIG. 31, in which the normals 20a', 30a' to the two contact surfaces 20a, 30a cannot be included in a common plane, can only be compensated for to a slight extent by an inventive thermally conductive device.

In order to provide improved compensation for deviations in parallelism in accordance with FIG. 31, the leg 70 can be given a bendable region 630 which extends from the first end 70a to the second end 70b diagonally across the leg 70.

This bendable region 630 may, for instance, be comprised of a material-thinning groove, according to FIG. 26, or the leg 70 may be divided into two with the two parts held together by a foil bridge or tie such as to form the bendable region 630 according to FIG. 27.

The bar 80 shown in FIG. 26 may conveniently be made of metal, such as copper, aluminium or silver.

When plates and foil bridge or ties are used, in accordance with FIG. 27, it may be convenient for the plates 90a, 90b, 90c to be made of copper and the foil bridge or tie 90 to be made of silver.

Figure 33:
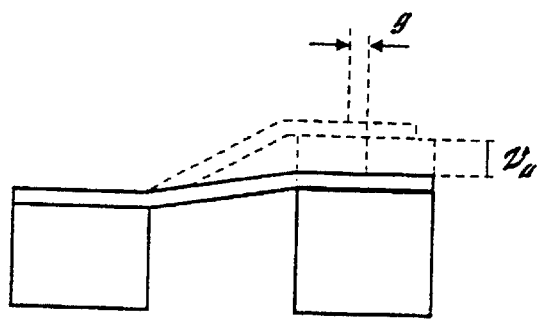
FIG. 33 illustrates schematically variations in the height or vertical dimension of one body in relation to another body.

FIG. 33 shows that when the perpendicular distance $V_a$ between the two contact surfaces 20a, 30a varies, it is necessary that one contact pad is attached to the body with which it coacts by a slidable "g" mechanical, thermally conductive contact.

Figure 34:
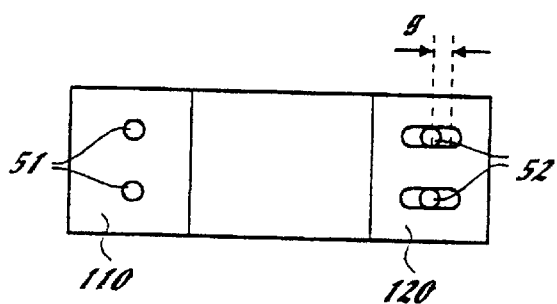
FIG. 34 illustrates possible attachments for fastening respective contact pads to respective bodies.

As illustrated in FIG. 34, one conceivable solution in this respect is to allow the mechanical contact 51 between the first contact pad 110 and the first body 20 to be comprised of a fixed mechanical, thermally conductive contact.

It is also conceivable for the mechanical contact 52 between the second contact pad and the second body 30 to be comprised of a slidable "g" mechanical, thermally conductive contact.

Figure 35:
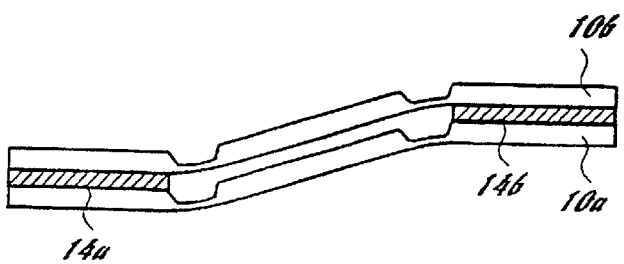
FIG. 35 illustrates an embodiment in which two thermally conductive devices are connected mutually in parallel.

When wishing to increase the thermal conductance to an extent above that which is obtained solely by decreasing the thickness of the thinned region, two or more thermally conductive devices can be connected in parallel, as illustrated in FIG. 35.

By including thermally conductive distances 14a, 14b between the two devices 10a, 10b, there is obtained a total thermal conductance which is half the thermal conductance afforded by one single device.

The bending resistance of the parallel-coupled device is two times that of the bending resistance of a single device.

If the thickness of the material in the bendable regions (and in the device as a whole) had been doubled instead, the effect on the thermal conductivity would have been the same as that achieved with two parallel-coupled devices, although the bending resistance would have been greatly increased, almost by a factor of eight, since the bending resistance is proportional to the height cubed ($h^3$).

It will be understood that the invention is not restricted to the aforedescribed and illustrated exemplifying embodiments thereof, and that modifications can be made within the scope of the inventive concept as defined in the following Claims.

What is claimed is:

1. A thermally conductive device intended for establishing mechanical and thermal contact between a first body and a second body, comprising:

a first and a second contact pad and a resilient element acting therebetween, wherein the first contact pad is adapted for coaction with a first contact surface on the first body, wherein the second contact pad is adapted for coaction with a second contact surface on the second body, and wherein the resilient element is adapted to exert a predetermined separating force on the first and said second contact pads such as to urge the first and second contact pads into contact with respective first and second contact surfaces, wherein the resilient element includes at least one bending region having a bending resistance which is representative of the predetermined force, the bending region having a thermal conductance that is lower than a thermal conductance of regions of the resilient element located adjacent the bending region, wherein the at least one bending region includes a first bending region, a second bending region, and a third bending region, and the resilient element includes at least one resilient configuration that comprises a first and a second leg, a first end of the first leg being connected to the first contact pad through the first bending region, a second end of the second leg being connected to the second contact pad through the second bending region; and a second end of the first leg is connected to a first end of the second leg through the third bending region.

2. A device according to claim 1, wherein at least one of the first bending region, the second bending region, and the third bending region has at least one of a different bending resistance and thermal conductance than another one of the first bending region, the second bending region, and the third bending region.

3. A device according to claim 1, wherein the resilient element includes two resilient configurations each including first, second, third bending regions, the two resilient configurations being adapted to be disposed in relation to one another such that the third bent regions of the two resilient configurations point towards one another between said first and second contact pads.

4. A device according to claim 1, wherein the first, second, and third bending regions include material-thinning grooves and are permanently bendable at the grooves.

5. A device according to claim 4, comprising a single bar provided with a plurality of material-thinning grooves between the first and second contact pads and the first, second, and third bending regions, the bar being permanently bendable at the grooves.

6. A device according to claim 5, wherein the first and second bending regions include a material-thinning groove on a first side of said the bar and the third bending region includes a material-thinning groove on a second side of the bar.

7. A device according to claim 5, wherein the bar has a material thickness of 0.2 to 1.0 mm.

8. A device according to claim 5, wherein the material-thinning groove has a material thickness of 0.01 to 0.5 mm.

9. A device according to claim 5, wherein the material-thinning groove has a width of 0.4 to 4 mm.

10. A device according to claim 1, wherein the first and second legs have a material-thinning groove that extends from the first end to second end of each of the first and second legs, diagonally across the first and second legs and meeting each other at the third bending region between the first and second legs.

11. A device according to claim 5, wherein the bar is comprised of metal.

12. A device according to claim 1, wherein the first and second contact pads and the first and second legs include plates and the first, second and third bending regions include bendable foil bridges between the plates.

13. A device according to claim 1, wherein the first and second bending regions are each a foil bridge that holds together mutually adjacent plates on a first side of the plates and the third bending region is a foil bridge that holds together mutually adjacent plates on a second side of the plates.

14. A device according to claim 12, wherein the plates have a material thickness of 0.2 to 1.0 mm.

15. A device according to claim 12, wherein the foil bridge has a material thickness of 0.01 to 0.5 mm.

16. A device according to claim 12, wherein two mutually adjacent plates are spaced apart by a distance of 0.4 to 4 mm.

17. A device according to claim 12, wherein the plates which form respective first and second legs are divided into two parts to form two-part plates having divisions diagonally across the first and second legs from the first end to the second end, wherein the divisions meet each other at the third bending region common to the first and said second legs and the two-part plates are held together by a foil bridge.

18. A device according to claim 12, wherein the plates comprise copper and the foil bridge comprises silver.

19. A device according to claim 12, wherein the plates are glued to the foil bridge.

20. A device according to claim 12, wherein the plates are soldered to the foil bridge.

21. A device according to claim 1, wherein the at least one bending region has a total bending resistance that enables the resilient element to be compressed to an extent of up to 1 mm in response to an applied force of about 1 Newton.

22. A device according to claim 1, wherein the device has a total thermal conductance of 5 to 15° C./W.

23. A device according to claim 1, wherein the device is adapted to establish mechanical and thermal contact between a first body, the first body being an electric component, and a second body, the second body being a cover for the component.

24. A device according to claim 1, wherein the second contact pad is adapted to be mechanically connected to a second body by a fixed mechanical, thermally conductive contact.

25. A device according to claim 24, wherein the fixed mechanical contact is a soldered contact.

26. A device according to claim 24, wherein the fixed mechanical contact is a glued contact.

27. A thermally conductive device intended for establishing mechanical and thermal contact between a first body and a second body for smoothing-out a temperature gradient occurring between the first and second bodies comprising: a first and a second contact pad and a resilient bendable element acting therebetween, wherein the first contact pad is adapted for coaction with a first contact surface belonging to a first body, the second contact pad is adapted for coaction with a second contact surface belonging to a second body, and wherein the bendable element is adapted to allow relative perpendicular movement between the first and second contact surfaces while maintaining coaction between the first contact pad and first contact surface and between the second contact pad and the second contact surface, the bendable element having at least one bendable region having a predetermined bending resistance, the bendable region having a thermal conductance that is lower than a thermal conductance of regions of the bendable element located adjacent the bendable region, wherein the at least one bending region includes a first bending region, and a second bending region, and the bendable element includes at least one leg, a first end of the at least one leg being connected to the first contact pad through a first bendable region and a second end of the leg being connected to the second contact pad through a second bendable region.

28. A device according to claim 27, wherein the first bendable region has at least one of a bending resistance and a thermal conductance that differs from a bending resistance and a thermal conductance, respectively, of the second bendable region.

29. A device according to claim 27, wherein the first and second bendable regions include material-thinning grooves.

30. A device according to claim 29, wherein the device includes a single bar that includes a plurality of material-thinning grooves.

31. A device according to claim 30, wherein the first bendable region includes a material-thinning groove on a first side of the bar and the second bendable region includes a material-thinning groove on a second side of the bar.

32. A device according to claim 30, wherein the bar has a material thickness of 0.2 to 1.0 mm.

33. A device according to claim 30, wherein the material-thinning groove has a material thickness of 0.01 to 0.5 mm.

34. A device according to claim 30, wherein the material-thinning groove has a width of 0.4 to 4 mm.

35. A device according to claim 27, wherein the at least one leg includes a material-thinning groove that extends diagonally across the at least one leg from said first end to said second end.

36. A device according to claim 30, wherein the bar is comprised of metal.

37. A device according to claim 27, wherein the first and second contact pads and the at least one leg are comprised of plates and the first and second bendable regions include a foil bridge.

38. A device according to claim 27, wherein the first bendable region includes a foil bridge that holds together mutually adjacent plates on a first side of the plates and the second bendable region includes a foil bridge that holds together mutually adjacent plates on a second side of the plates.

39. A device according to claim 37, wherein the plates have a thickness of 0.2 to 1.0 mm.

40. A device according to claim 37, wherein the foil bridge has a material thickness of 0.01 to 0.5 mm.

41. A device according to claim 37, wherein a spacing between two mutually adjacent plates is 0.4 to 4 mm.

42. A device according to claim 27, wherein the plate that forms the legs is divided into two parts from the first end to the second end diagonally across said legs and is a two-part plate, the two-part plate being held together by a foil bridge.

43. A device according to claim 37, wherein the plates include copper and the foil bridge includes silver.

44. A device according to claim 37, wherein the foil bridge is glued to the plates.

45. A device according to claim 37, wherein the foil bridge is soldered to the plates.

46. A device according to claim 27, wherein the device has a total thermal conductance of 5 to 15° C./W.

47. A device according to claim 27, wherein the first body is an electric component and the second body is a cooling body.

48. A device according to claim 27, wherein the first contact pad is adapted to mechanically contact the first body with a fixed mechanical, thermally conductive contact.

49. A device according to claim 27, wherein the second contact pad is adapted to mechanically contact the second body with a slidable mechanical, thermally conductive contact.

50. A device according to claim 2, wherein the resilient element includes two resilient configurations, each resilient configuration including first and second legs, the conductive device further including first, second, and third bending regions associated with each resilient configuration, the two resilient configurations being adapted to be disposed in relation to one another such that the third bent regions of the two resilient configurations point towards one another between said first and second contact pads.

51. A device according to claim 2, wherein the first, second, and third bending regions include material-thinning grooves and are permanently bendable at the grooves.

52. A device according to claim 3, wherein the first, second, and third bending regions include material-thinning grooves and are permanently bendable at the grooves.

53. A device according to claim 4, wherein the first and second legs have a material-thinning groove that extends from the first end to second end of each of the first and second legs, diagonally across the first and second legs and meeting each other at the third bending region between the first and second legs.

54. A device according to claim 5, wherein the first and second legs have a material-thinning groove that extends from the first end to second end of each of the first and second legs, diagonally across the first and second legs and meeting each other at the third bending region between the first and second legs.

55. A device according to claim 2, wherein the first and second contact pads and the first and second legs include plates and the first, second and third bending regions include bendable foil bridges between the plates.

56. A device according to claim 3, wherein the first and second contact pads and the first and second legs include plates and the first, second and third bending regions include bendable foil bridges between the plates.

57. A device according to claim 12, wherein the first and second bending regions are each a foil bridge that holds together mutually adjacent plates on a first side of the plates and the third bending region is a foil bridge that holds together mutually adjacent plates on a second side of the plates.

58. A device according to claim 17, wherein the plates are glued to the foil bridge.

59. A device according to claim 17, wherein the plates are soldered to the foil bridge.

60. A device according to claim 1, wherein the second contact pad is adapted to be mechanically connected to the second body by a fixed mechanical, thermally conductive contact.

61. A device according to claim 28, wherein the first and second bendable regions include material-thinning grooves.

62. A device according to claim 29, wherein the first and second contact pads and the at least one leg are comprised of plates and the first and second bendable regions include a foil bridge.

63. A device according to claim 30, wherein the at least one leg includes a material-thinning groove that extends diagonally across the at least one leg from said first end to said second end.

64. A device according to claim 28, wherein the first and second contact pads and the at least one leg are comprised of plates and the first and second bendable regions include a foil bridge.

65. A device according to claim 37, wherein the first bendable region includes a foil bridge that holds together mutually adjacent plates on a first side of the plates and the second bendable region includes a foil bridge that holds together mutually adjacent plates on a second side of the plates.

66. A device according to claim 29, wherein the plate that forms the legs is divided into two parts from the first end to the second end diagonally across said legs and and is a two-part plate, the two-part plate being held together by a foil bridge.

67. A device according to claim 37, wherein the plate that forms the legs is divided into two parts from the first end to the second end diagonally across said legs and is a two-part plate, the two-part plate being held together by a foil bridge.

68. A device according to claim 42, wherein the foil bridge is glued to the plates.

69. A device according to claim 42, wherein the foil bridge is soldered to the plates.

70. A device according to claim 27, wherein the first contact pad is adapted to mechanically contact the first body with a fixed mechanical, thermally conductive contact.

71. A device according to claim 27, wherein the second contact pad is adapted to mechanically contact the second body with a slidable mechanical, thermally conductive contact.

72. A device according to claim 48, wherein the second contact pad is adapted to mechanically contact the second body with a slidable mechanical, thermally conductive contact.

73. A device according to claim 1, wherein the first and second contact pads and the resilient element are formed from a single piece of material.

74. A device according to claim 27, wherein the first and second contact pads and the resilient element are formed from a single piece of material.

* * * * *